United States Patent [19]
Klemmer

[11] Patent Number: 6,150,882
[45] Date of Patent: Nov. 21, 2000

[54] RF LOW NOISE AMPLIFIER

[75] Inventor: Nikolaus Klemmer, Apex, N.C.

[73] Assignee: Ericsson Inc., Research Triangle Park, N.C.

[21] Appl. No.: 09/215,528

[22] Filed: Dec. 18, 1998

[51] Int. Cl.$^7$ ...................................................... H03F 3/45
[52] U.S. Cl. ........................................... 330/253; 330/295
[58] Field of Search ................................. 330/253; 4/295

[56] References Cited

U.S. PATENT DOCUMENTS

| | | | |
|---|---|---|---|
| 5,216,380 | 6/1993 | Carbou ..................................... | 330/253 |
| 5,381,112 | 1/1995 | Rybicki et al. ........................... | 330/253 |
| 5,854,574 | 12/1998 | Singer et al. ............................. | 330/253 |

*Primary Examiner*—Robert Pascal
*Assistant Examiner*—Khanh Van Nguyen
*Attorney, Agent, or Firm*—Wood, Phillips, VanSanten, Clark & Mortimer

[57] ABSTRACT

In a communication transceiver receiving a signal from a signal source defined by a source impedance between first and second nodes, an amplifier is provided having an input impedance matched to the source impedance. The amplifier includes a first transconductance cell having a first transconductance related to the input impedance and including first and second transistors each having control, supply and output elements. The first transconductance cell receives the signal from the signal source at the first and second control elements and develops a modified version of the signal as an output current signal at the first and second output elements, respectively. The first and second transistors are interconnected such that the control element of the first transistor is connected to the output element of the second transistor, and the control element of the second transistor is connected to the output element of the first transistor. The amplifier further includes a second transconductance cell having a second transconductance related to the input impedance and including third and fourth transistors connected to the first and second output elements. The second transconductance cell combines currents appearing at the first and second output elements and develops a combined output current signal at respective output terminals thereof.

13 Claims, 5 Drawing Sheets

ововCLUD

RF LOW NOISE AMPLIFIER

FIELD OF THE INVENTION

The present invention is directed toward amplifiers utilized in communication transceivers and, more particularly, toward an RF low noise, power-matched amplifier.

BACKGROUND OF THE INVENTION

Low Noise Amplifiers (LNAs) are typically used in communication transceivers for the amplification of weak electrical signals. In typical wireless applications, LNAs are generally fabricated in bipolar semiconductor or GaAs MESFET technologies. Two main concerns associated with the design of amplifiers utilized for low noise RF (Radio Frequency) amplification are: (1) the minimization of noise added to the signal by the amplifier; and (2) achieving maximum power transfer between a source producing the electrical signal and the amplifier.

In order to achieve maximum power transfer between the source and the amplifier, the input impedance ($Z_{IN}$) of the amplifier must be equal to the complex conjugate of the source output impedance ($Z_S$), namely, $Z_{IN}=Z_S^*$. In the case where the output impedance of the source is real ($Z_S=R_S$), then the input impedance of the amplifier must also be real ($Z_{IN}=R_{IN}$). For maximum power transfer between the source and the amplifier, $R_{IN}=R_S$. This is commonly referred to as "power-matching".

The noise added to the signal by the amplifier results in a degradation of the signal-to-noise ratio (S/N) at the output of the amplifier. A figure of merit for the amount of noise added by the amplifier is the ratio of the signal-to-noise ratio at the input $(S/N)_{IN}$ to the signal-to-noise ratio at the output of the amplifier $(S/N)_{OUT}$. This ratio is commonly referred to as the Noise Factor (F) of the amplifier, and is used to calculate the Noise Figure (NF) of the amplifier according to the formula $NF=10 \log_{10}(F)$, where $F=(S/N)_{IN}/(S/N)_{OUT}$.

Typically, amplifiers are integrated as monolithic ASICs (Application Specific Integrated Circuits). Maintaining a power-matched condition very accurately over production tolerances of the components that are used in the amplifier has traditionally been difficult. This especially presents a problem when the power-matched amplifier is used at the output of a filter, e.g., crystal filter, SAW filter, etc., whose components typically have a high sensitivity with respect to changes in the source output and termination (amplifier input) impedances. While external matching networks can be added to achieve power-matching, they typically result in noise increase. Accordingly, maintaining a proper power-matched input impedance of the amplifier following the filter over temperature and process spread of the components, while at the same time minimizing the Noise Figure of the amplifier, is critical for the overall performance of the system in which these components are utilized. Generally, an improvement in one area has resulted in a penalty in the other area.

One prior art LNA is the common-gate amplifier. The common-gate amplifier achieves a well defined input impedance without the addition of an external matching network. However, one disadvantage of the common-gate amplifier is that it has a Noise Figure which is generally too high for various wireless and cellular applications. A further disadvantage of the common-gate amplifier is that it has a relatively low current gain, which makes it difficult to achieve a sufficient power gain in the amplifier.

Another prior art LNA is the common-source amplifier. The common-source amplifier typically has a high input impedance and requires an external matching network to achieve power-matching. However, since the common-source amplifier is a single ended circuit, undesirable feedback paths typically result around the amplifier which reduces the gain. The feedback paths may also cause parasitic oscillations and, accordingly, great care must be taken to ensure operational stability of the amplifier. This is difficult in volume production situations. A further disadvantage of the common-source amplifier is in its performance (other than Noise Figure). The external matching network, which is necessary to achieve power-matching, causes distortion in the current signal output by the amplifier, thus degrading its performance.

The present invention is directed toward overcoming one or more of the above-mentioned problems.

SUMMARY OF THE INVENTION

In a communication transceiver receiving a signal from a signal source defined by a source impedance between first and second nodes, an amplifier is provided according to the present invention having an input impedance matched to the source impedance. The inventive amplifier includes a first transconductance cell having a first transconductance related to the input impedance, and including first and second transistors each having control, supply and output elements. The first transconductance cell receives the signal from the signal source at the first and second control elements and develops a modified version of the signal as an output current signal at the first and second output elements, respectively. The first and second transistors are interconnected such that the control element of the first transistor is connected to the output element of the second transistor, and the control element of the second transistor is connected to the output element of the first transistor. The inventive amplifier further includes a second transconductance cell having a second tranconductance related to the input impedance, and including third and fourth transistors connected to the first and second output elements. The second transconductance cell combines currents appearing at the first and second output elements and develops a combined output current signal at respective output terminals thereof.

In one form, the first transconductance and the second transconductance are not equal. Preferably, the second transconductance is less than the first transconductance.

In another form, the third and fourth transistors each have control, supply and output elements, with the third and fourth supply elements connected to the first and second output elements, with the combined output current signal developed at the third and fourth output elements.

In another form, the first through fourth transistors include Metal Oxide Semiconductor Field Effect Transistors (MOSFETs) having gate, source and drain elements corresponding to the control, supply and output elements, respectively.

In another form, the first through fourth transistors include n-channel MOSFETs. The first through fourth transistors are interconnected such that the third source element is connected to the first drain element, and the fourth source element is connected to the second drain element.

In yet another form, the first and second transistors include p-channel MOSFETs, and the third and fourth transistors include n-channel MOSFETs. The first through fourth transistors are interconnected such that the third source element is connected to the second drain element, and the fourth source element is connected to the first drain element.

In still another form, the first transconductance cell includes a differential amplifier receiving the signal from the signal source and developing a differential output current signal at the first and second output elements.

In a communication transceiver receiving a signal from a signal source defined by a source impedance between first and second nodes, an amplifier according to an alternative embodiment of the present invention is provided having an input impedance matched to the source impedance. The inventive amplifier according to the alternative embodiment includes a first transconductance cell having a first transconductance related to the input impedance, and including first and second transistors connected to the first and second nodes, respectively. The first and second transistors receive the signal from the signal source and develop a modified version of the signal as a first output current signal at first and second output terminals, respectively. A second transconductance cell is provided having a second transconductance related to the input impedance, and including third and fourth transistors connected to the first and second nodes, respectively. The third and fourth transistors also receive the signal from the signal source and develop a modified version of the signal as a second output current signal at third and fourth output terminals, respectively. Enhancing the performance of the amplifier are oppositely connected first and second inverter circuits are also provided between the first and second nodes.

In one form of the alternative embodiment, the first through fourth transistors each have control, supply and output elements. The first through fourth transistors are interconnected such that the first and third supply elements are connected to the first node, and the second and fourth supply elements are connected to the second node. The first and second output elements define the first and second output terminals of the first transconductance cell, while the third and fourth output elements define the third and fourth output terminals of the second transconductance cell.

In another form of the alternative embodiment, the first through fourth transistors include Metal Oxide Semiconductor Field Effect Transistors (MOSFETs) having gate, source and drain elements corresponding to the control, supply and output elements, respectively.

In yet another form of the alternative embodiment, the first and second transistors include n-channel MOSFETs, while the third and fourth transistors include p-channel MOSFETs.

In still another form of the alternative embodiment, a first combiner circuit is provided which receives the first output current signal from the first and second output terminals and develops a first differential current signal. A second combiner circuit is provided which receives the second output current signal from the third and fourth output terminals and develops a second differential current signal. Finally, a third combiner circuit is provided which receives the first and second differential current signals from the first and second combiner circuits, respectively, and develops a third differential current signal.

An object of the present invention is to provide a low noise amplifier with a very well controlled input impedance.

Another object of the present invention is to provide a low noise amplifier having an input impedance that does not significantly vary over temperature and process spread of amplifier components.

A further object of the present invention is to reduce the Noise Figure associated with a low noise, power-matched amplifier.

A still further object of the present invention is to provide a low noise, power-matched amplifier without the need for an external matching network.

Yet a further object of the present invention is to integrate the analog portion of a transceiver in CMOS (Complementary Metal Oxide Semiconductor) technology.

Other aspects, objects and advantages of the present invention can be obtained from a study of the application, the drawings, and the appended claims.

DETAILED DESCRIPTION OF THE PREFERRED EMBODIMENTS

Figures 1, 2:
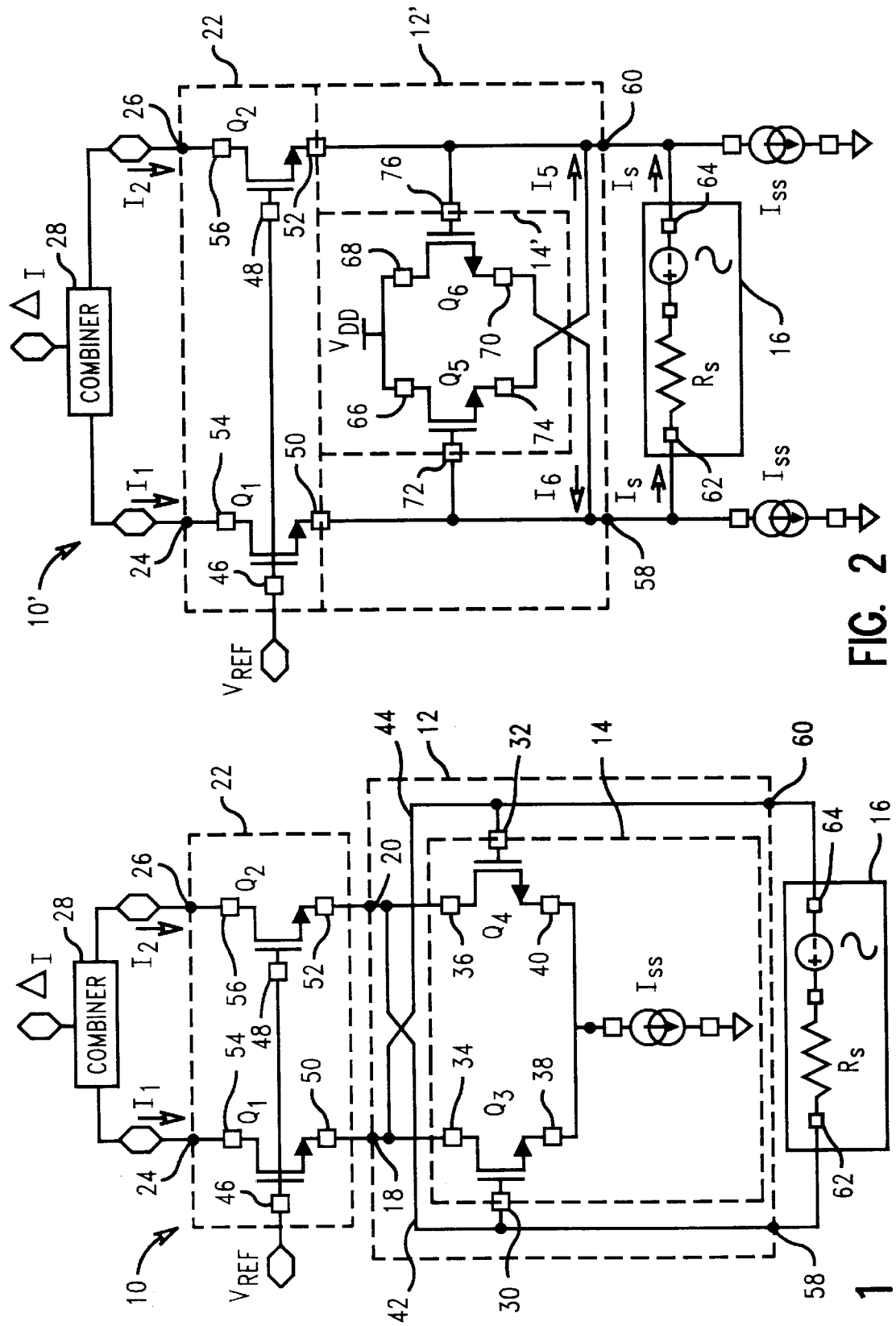
FIG. 1 illustrates an amplifier circuit according to the present invention.
FIG. 2 illustrates an alternative form of the inventive amplifier circuit shown in FIG. 1.

FIG. 1 illustrates the inventive amplifier topology, shown generally at 10, which achieves a power-matched condition while minimizing noise added by the amplifier.

The inventive amplifier 10 includes an amplifier circuit 12 having a $G_M$ (transconductance) cell 14 receiving a voltage signal from a source 16, the amplifier circuit 12 developing an output current signal at output nodes 18,20. A current collector circuit 22 receives the current signal output from the amplifier circuit 12 and develops an output current signal represented by $I_1, I_2$ at respective output nodes 24,26. The output currents $I_1$ and $I_2$ are conventionally combined by a combiner 28, which takes the difference between the output currents $I_1$ and $I_2$ and produces an output current $\Delta I = I_1 - I_2$.

The $G_M$ cell 14 includes a typical differential amplifier including transistors $Q_3$ and $Q_4$, and a current source $I_{SS}$. Preferably, the transistors $Q_3$ and $Q_4$ are Metal Oxide Semiconductor Field Effect Transistors (MOSFETs), with the transistors $Q_3$ and $Q_4$ implemented as n-channel devices. The transistors $Q_3$ and $Q_4$ include gate, drain and source elements generally referred to control, output and supply elements, respectively.

The gates 30 and 32 of transistors $Q_3$ and $Q_4$ define input terminals of the $G_M$ cell 14. The drains 34 and 36 of transistors $Q_3$ and $Q_4$ define output terminals of the $G_M$ cell 14. The current source $I_{SS}$ is connected between the sources 38 and 40 of transistors $Q_3$ and $Q_4$ and ground.

The gate 30 of transistor $Q_3$ is connected to the drain 36 of transistor $Q_4$ via line connection 42. Similarly, the gate 32 of transistor $Q_4$ is connected to the drain 34 of transistor $Q_3$ via line connection 44. Typically, the resistances associated with the line connections 42 and 44 are negligible and can be ignored.

The current collector 22 includes transistors $Q_1$ and $Q_2$ (preferably n-channel MOSFETs) connected in a common-gate topology. A reference voltage source $V_{REF}$ applies a reference voltage to the gates 46 and 48 of transistors $Q_1$ and $Q_2$. The sources 50 and 52 of transistors $Q_1$ and $Q_2$ correspond to the input terminals of the current collector 22. The drains 54 and 56 of transistors $Q_1$ and $Q_2$ correspond to the output terminals 24 and 26 of the current collector 22. The drains 54 and 56 of transistors $Q_1$ and $Q_2$ are connected to a DC voltage source $V_{DD}$ (not shown) which, along with the current source $I_{SS}$, establishes a DC bias current through the transistors $Q_1$, $Q_2$, $Q_3$ and $Q_4$. For symmetry reasons, transistors $Q_1$ and $Q_2$ are sized the same, and transistors $Q_3$ and $Q_4$ are sized the same.

The input resistance $R_{IN}$ of the inventive amplifier 10 is the resistance seen by the source 16 across the amplifier input nodes 58 and 60. The source resistance $R_S$ is the resistance across the source nodes 62 and 64. In the case of a filter, the source resistance $R_S$ will be known, i.e., provided by the filter manufacturer. To achieve a power-matched condition, the input resistance $R_{IN}$ of the inventive amplifier 10 must be equal to the source resistance $R_S$ of the source 16 ($R_{IN}=R_S$).

Operation of the inventive amplifier 10 is as follows. Assuming the voltage at the source node 62 increases by $\Delta V$, the voltage at the source node 64 correspondingly decreases by $\Delta V$ (the voltage signal supplied by the source 16 is typically an AC signal). The gate voltage of transistor $Q_3$ will increase by $\Delta V$, and similarly, the gate voltage of transistor $Q_4$ will decrease by $\Delta V$. As a result of the cross connection via line connections 42 and 44, the source voltage of transistor $Q_2$ will increase by $\Delta V$, and similarly, the source voltage of transistor $Q_1$ will decrease by $\Delta V$. Accordingly, the currents flowing through transistors $Q_1$ and $Q_3$ will increase since the gate-source voltages of transistors $Q_1$ and $Q_3$ have increased. Similarly, the currents flowing through transistors $Q_2$ and $Q_4$ will decrease since the gate-source voltages of transistors $Q_2$ and $Q_4$ have decreased. This results in an increase in the output current signal $I_1$, and a corresponding decrease in the output current signal $I_2$. Accordingly, the output current signal $\Delta I$ is enhanced since $\Delta I = I_1 - I_2$.

The input impedance $R_{IN}$ of the inventive amplifier 10 as seen by the source 16 across input nodes 58 and 60 is calculated to be $R_{IN}=2/(g_{m12}-g_{m34})$, where $g_{m12}$ denotes the transconductance of the current collector 22 (transistors $Q_{1,2}$) and $g_{m34}$ denotes the transconductance of the $G_M$ cell 14 (transistors $Q_{3,4}$). Proper operation of the inventive amplifier 10 requires that the transconductance $g_{m34}$ be less than the transconductance $g_{m12}$, since equal transconductances ($g_{m12}=g_{m34}$) would cause the input impedance $R_{IN}$ to be infinite. (While noise will always be added by both the current collector 22 and the $G_M$ cell 14, since the transconductance $g_{m34}$ of the $G_M$ cell 14 will always be less than the transconductance $g_{m12}$ of the current collector 22, the noise generated by the $G_M$ cell 14 will always be less than the noise generated by the current collector 22. Under power-matched conditions ($R_S=R_{IN}$), the Noise Factor, and hence the Noise Figure, of the inventive amplifier 10 is minimized if $g_{m12}R_S=2\sqrt{2}$.

FIG. 2 illustrates an alternative form of the inventive amplifier 10 of FIG. 1, shown generally at 10', with like elements indicated with the same reference number and elements requiring modification indicated with a prime ('). Basically, the $G_M$ cell 14' includes p-channel MOSFETs $Q_5$ and $Q_6$, replacing the n-channel MOSFETs $Q_3$ and $Q_4$ shown and described with respect to FIG. 1. The sources 66 and 68 of transistors $Q_5$ and $Q_6$ are connected to a positive supply voltage $V_{DD}$. The drain 70 of transistor $Q_6$ is connected to the gate 72 of transistor $Q_5$, and also to the source 50 of transistor $Q_1$. Similarly, the drain 74 of transistor $Q_5$ is connected to the gate 76 of transistor $Q_6$, and also to the source 52 of transistor $Q_2$. Since there is no reuse of supply current by the $G_M$ cell 14', two supply current sources $I_{SS}$ are required. Again, for symmetry reasons, transistors $Q_1$ and $Q_2$ are sized the same, and transistors $Q_5$ and $Q_6$ are sized the same. Operation of the inventive amplifier 10' is as follows.

Assume the voltage at the source node 64 increases by $\Delta V$, the voltage at the source node 62 correspondingly decreases by $\Delta V$. The gate voltage of transistor $Q_6$ increases by $\Delta V$, which decreases the current $I_6$ flowing through transistor $Q_6$ since the source-gate voltage of transistor $Q_6$ decreases. Similarly, the gate voltage of transistor $Q_5$ decreases by $\Delta V$, which increases the current $I_5$ flowing through transistor $Q_5$ since the source-gate voltage of transistor $Q_5$ is increased. As will be described in more detail below, this results in a decrease in the output current signal $I_2$ and a corresponding increase in the output current signal $I_1$, which further results in an enhanced differential output current signal $\Delta I$ output by the combiner 28.

Applying Kirchhoff's current law at the input node 60, the output current signal $I_2$ is found to be equal to $I_2=I_{SS}-I_S-I_5$, where $I_S$ is the current flowing from the source 16. The current source $I_{SS}$ is constant; the source current $I_S$ increases due to the increase in voltage ($\Delta V$) at the source node 64; and the current $I_5$ flowing through transistor $Q_5$ increases due to the source-gate voltage increase of transistor $Q_6$. Accordingly, the output current signal $I_2$ decreases.

Similarly, on the left-hand side of the inventive amplifier 10', applying Kirchhoff's current law at the input node 58, the output current signal $I_1$ is found to be equal to $I_1=I_{SS}+I_S-I_6$. The current source $I_{SS}$ is constant; the source current $I_S$ increases due to the voltage decrease ($\Delta V$) at the source node 62; and the current $I_6$ flowing through the transistor $Q_6$ decreases due to the source-gate voltage decrease of transistor $Q_6$. Accordingly, the output current signal $I_1$ increases. As previously noted, the differential output current signal $\Delta I$, given by the formula $I_1-I_2$, is thus enhanced.

The transistors $Q_1$, $Q_2$, $Q_5$ and $Q_6$ are chosen for power-matching and noise minimization in the same manner as previously described with respect to FIG. 1, with transistors $Q_5$ and $Q_6$ simply replacing transistors $Q_3$ and $Q_4$ in the calculations.

Figure 3:
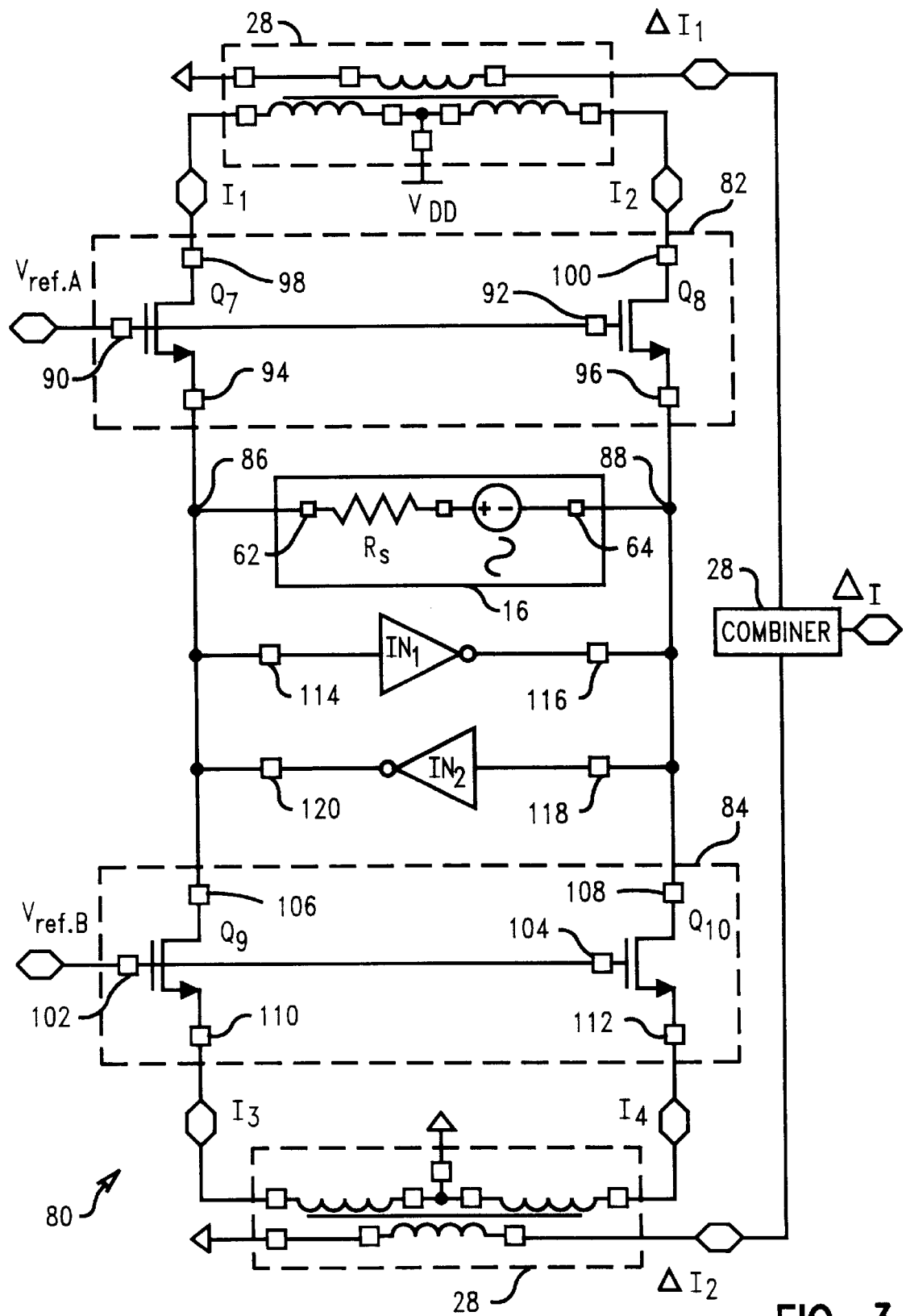
FIG. 3 illustrates an alternative embodiment of the amplifier circuit according to the present invention.

FIG. 3 illustrates a detailed implementation of an alternative embodiment of the inventive amplifier topology, shown generally at 80. The inventive amplifier 80 includes first 82 and second 84 $G_M$ cells, each connected to the source 16 at nodes 86 and 88. More specifically, the $G_M$ cell 82 includes n-channel MOSFETs $Q_7$ and $Q_8$ connected in a common-gate stage. The gates 90 and 92 of transistors $Q_7$ and $Q_8$ receive a reference voltage $V_{refA}$ which controls the DC bias current flowing through the transistors $Q_7$ and $Q_8$. The source 94 of transistor $Q_7$ is connected to the node 86, while the source 96 of transistor $Q_8$ is connected to the node 88. The drains 98 and 100 of transistors $Q_7$ and $Q_8$ correspond to the output terminals of the $G_M$ cell 82.

The $G_M$ cell 84 includes p-channel MOSFETs $Q_9$ and $Q_{10}$ also connected in a common-gate stage. The gates 102 and 104 of transistors $Q_9$ and $Q_{10}$ receive a reference voltage $V_{refB}$ which controls the DC bias current flowing through the transistors $Q_9$ and $Q_{10}$. The source 106 of transistor $Q_9$ is connected to the node 86, while the source 108 of transistor $Q_{10}$ is connected to the node 88. The drains 110 and 112 of transistors $Q_9$ and $Q_{10}$ correspond to the output terminals of the $G_M$ cell 84.

Figure 4:
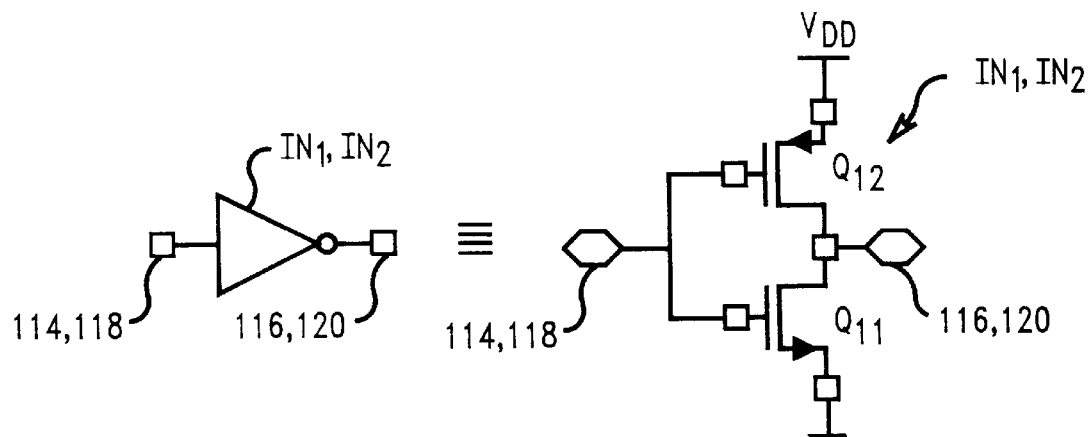
FIG. 4 illustrates a detailed implementation of the inverter circuits shown in FIG. 3.

A first inverter circuit $IN_1$ is connected between the nodes 86 and 88, with the input terminal 114 of the inverter $IN_1$ connected to the node 86 and its output terminal 116 connected to the node 88. A second inverter circuit $IN_2$ is also connected between the nodes 86 and 88, but in an opposite fashion to that of the inverter $IN_1$. The input terminal 118 of the inverter $IN_2$ is connected to the node 88, while its output terminal 120 is connected to the node 86. FIG. 4 illustrates a typical implementation of the inverter circuits $IN_1$, $IN_2$ utilizing n-channel $Q_{11}$ and p-channel $Q_{12}$ MOSFETs.

Referring back to FIG. 3, operation of the inventive amplifier 80 is as follows. Assume the voltage at the source node 64 increases by $\Delta V$, the voltage at the source node 62 correspondingly decreases by $\Delta V$. The increased voltage ($\Delta V$) at the source node 64 is applied to the sources 96 and 108 of transistors $Q_8$ and $Q_{10}$. The output current signal $I_2$ will decrease since the gate-source voltage of transistor $Q_8$ decreases. Similarly, the output current signal $I_4$ will increase since the source-gate voltage of transistor $Q_{10}$ increases.

On the other side of the inventive amplifier 80, the decreased voltage ($\Delta V$) at the source node 62 is applied to the sources 94 and 106 of transistors $Q_7$ and $Q_9$. The output current signal $I_1$ will increase since the gate-source voltage of transistor $Q_7$ increases. Similarly, the output current signal $I_3$ will decrease since the source-gate voltage of transistor $Q_9$ decreases.

The inverters $IN_1$ and $IN_2$ enhance operation of the inventive amplifier 80 as follows. The decreased voltage ($\Delta V$) at the source node 62 is received at the input terminal 114 of the inverter $IN_1$. As the voltage at the input terminal 114 decreases, the voltage at the output terminal 116 of the inverter $IN_1$ correspondingly increases. This adds to the increased voltage ($\Delta V$) applied to the sources 96 and 108 of transistors $Q_8$ and $Q_{10}$, further decreasing the output current signal $I_2$ and increasing the output current signal $I_4$. Similarly, the increased voltage ($\Delta V$) at the source node 64 is applied to the input terminal 118 of the inverter $IN_2$. As the voltage at the input terminal 118 increases, the voltage at the output terminal 120 of the inverter $IN_2$ correspondingly decreases. This adds to the decreased voltage ($\Delta V$) applied to the sources 94 and 106 of transistors $Q_7$ and $Q_9$, further increasing the output current signal $I_1$ and decreasing the output current signal $I_3$.

The output current signals $I_1$ and $I_2$ are combined by a conventional combiner 28, which takes the difference between the output current signals $I_1$ and $I_2$ and outputs a resultant output current signal $\Delta I_1 = I_1 - I_2$. The output current signals $I_3$ and $I_4$ are also combined by a conventional combiner 28, which takes the difference between the output current signals $I_3$ and $I_4$ and outputs a resultant output current signal $\Delta I_2 = I_3 - I_4$. Finally, the output current signals $\Delta I_1$ and $\Delta I_2$ are further combined by another conventional combiner 28, which takes the difference between the output current signals $\Delta I_1$ and $\Delta I_2$ and outputs a resultant output current signal $\Delta I = \Delta I_1 - \Delta I_2$.

In a preferred implementation, the transconductances of $G_M$ cells 82 and 84 are equal. Due to the parallel connection of the $G_M$ cells 82 and 84, in order to achieve an overall input resistance $R_{IN}$, wherein $R_{IN} = R_S$, the input impedance of each $G_M$ cell must be set equal to $2R_{IN}$. An advantage of the inventive amplifier 80 is that it can operate with one-half of the supply current typically utilized by the inventive amplifier 10 shown in FIG. 1.

For enhanced noise cancellation and gain increase, the inverters $IN_1$ and $IN_2$ are designed such that the transconductance of each inverter $IN_1$ and $IN_2$ is equal to the transconductance of the $G_M$ cell 14 as shown and described with respect to FIG. 1.

Figure 5:
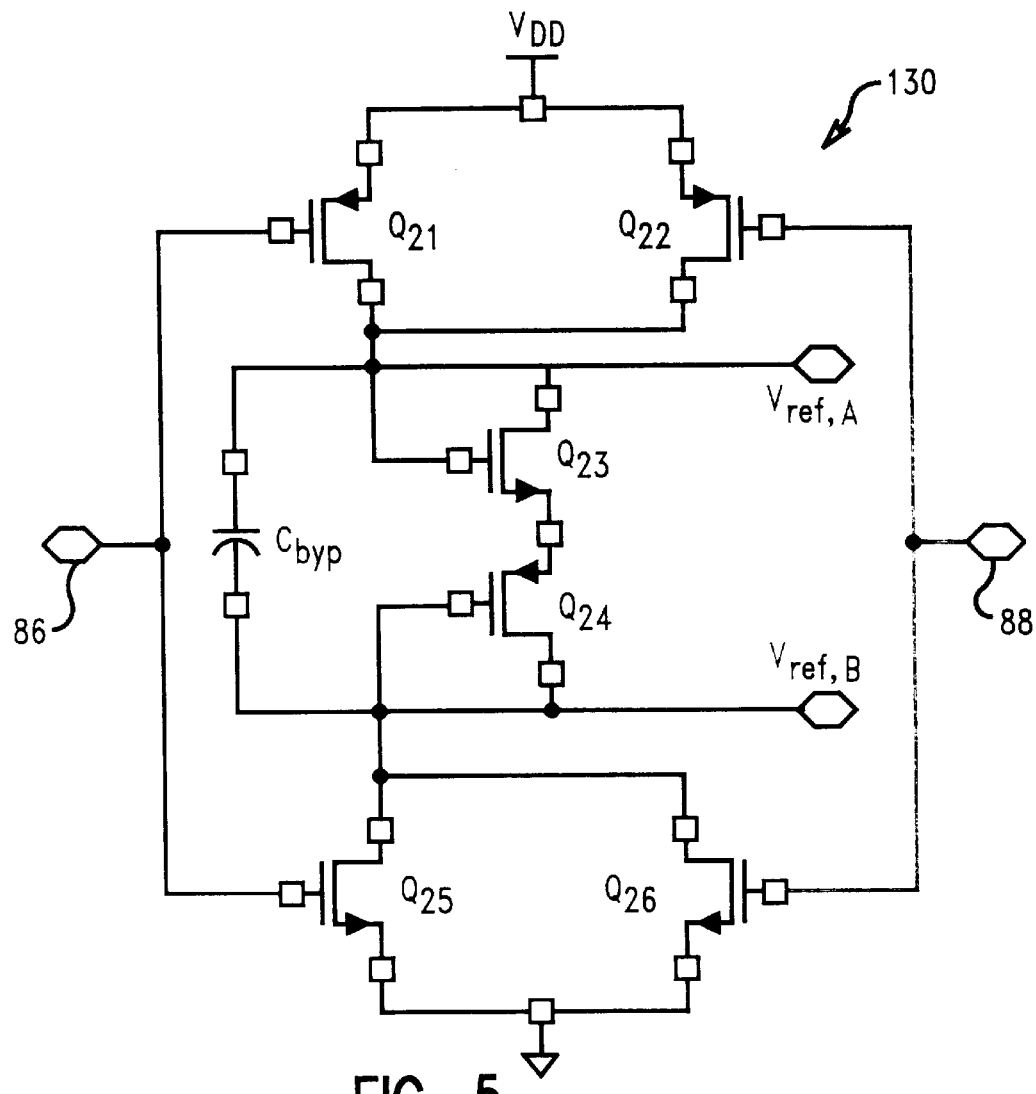
FIG. 5 illustrates an exemplary biasing circuit for producing the biasing voltages $V_{ref,A}$ and $V_{ref,B}$ shown in FIG. 3.

It should be noted that the reference voltages $V_{refA}$ and $V_{refB}$ are constant. The voltage difference between reference voltages $V_{refA}$ and $V_{refB}$ determines the amount of DC bias current flowing through the transistors $Q_7, Q_9$ and $Q_8, Q_{10}$. FIG. 5 illustrates an exemplary biasing circuit, shown generally at 130, for producing the biasing voltages $V_{refA}$ and $V_{refB}$. The transistors $Q_{23}$ and $Q_{24}$ are replicas (same channel length and width) of transistors $Q_7$ and $Q_9$, or transistors $Q_8$ and $Q_{10}$ in FIG. 3 (for symmetry reasons transistors $Q_7$ and $Q_8$ are sized the same, and transistors $Q_9$ and $Q_{10}$ are sized the same). Transistor pairs $Q_{21}, Q_{22}$ and $Q_{25}, Q_{26}$ center the bias voltage of the circuit 130 within the available supply voltage $V_{DD}$, and also assure that the voltages at the input nodes 86 and 88 are equal. The bypass capacitor $C_{byp}$ filters the bias voltages such that the added noise generated by the biasing circuit 130 is negligible at its operating frequency. It should be noted that the biasing circuit 130 is illustrated for exemplary purposes only, and any biasing circuit capable of generating reference voltages such that a predetermined DC biasing current flows through the transistors $Q_1$, $Q_2$, $Q_3$ and $Q_4$ may be utilized without departing from the spirit and scope of the present application.

Figure 6:
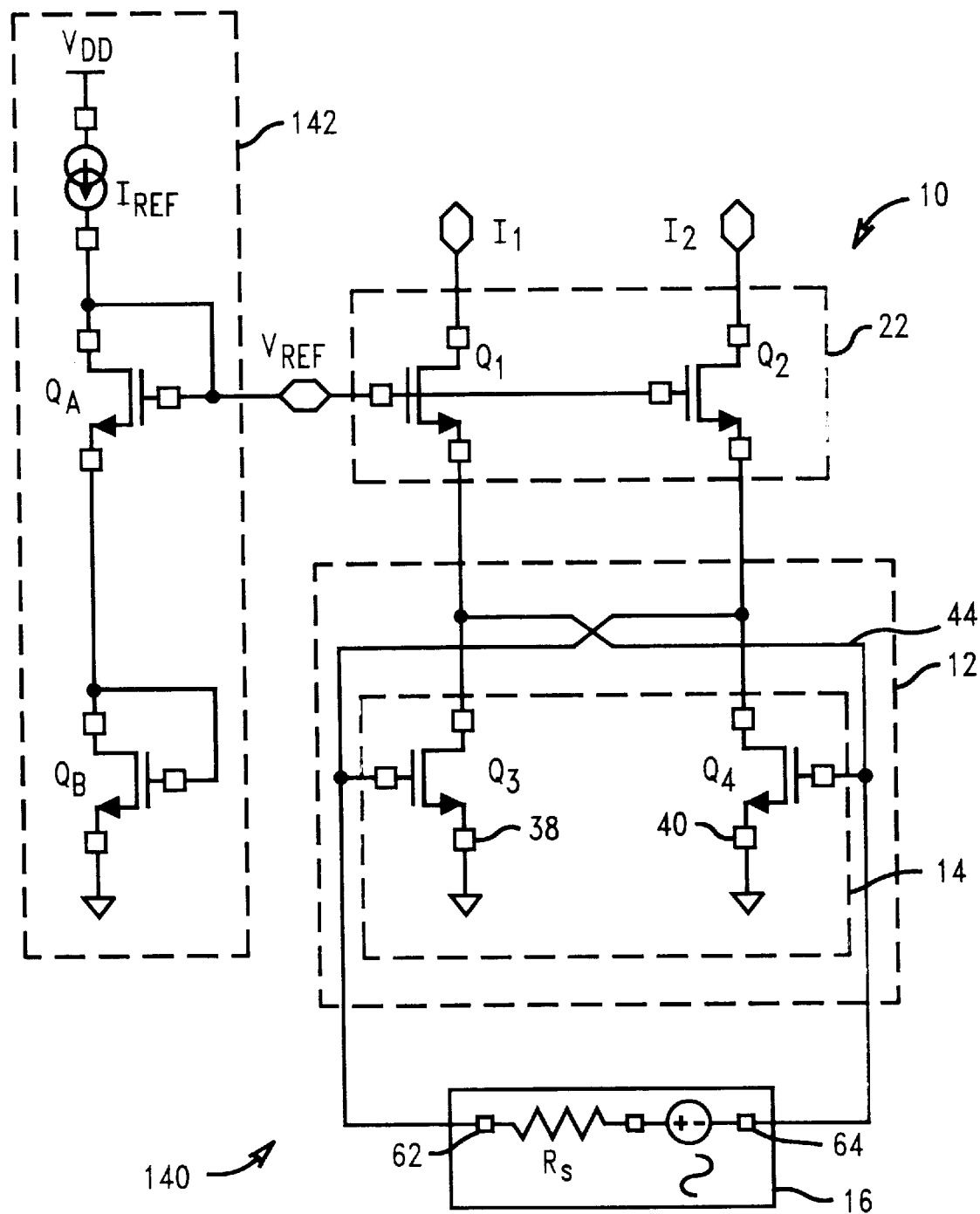
FIG. 6 illustrates the inventive amplifier circuit shown in FIG. 1 utilized in a quasi-differential circuit.

FIG. 6 illustrates the inventive amplifier topology 10 of FIG. 1 implemented in a quasi-differential circuit, shown generally at 140. The current source $I_{SS}$ has been removed from the $G_M$ cell 14, and the sources 38 and 40 of transistors $Q_3$ and $Q_4$ are connected directly to ground. The removal of the current source $I_{SS}$ necessitates the addition of a biasing circuit 142 connected to the node $V_{REF}$, which is a common biasing circuit to determine the DC bias current of an amplifier. Transistor $Q_A$ is replica of transistors $Q_1$ and $Q_2$, while transistor $Q_B$ is a replica of transistors $Q_3$ and $Q_4$. The reference voltage $V_{REF}$ is established based upon the reference current $I_{REF}$. The reference current $I_{REF}$ establishes gate-source voltage drops across transistors $Q_A$ and $Q_B$. The gate-source voltage drops on transistors $Q_1$ and $Q_2$ mirror the gate-source voltage drop on transistor $Q_A$. Similarly, the gate-source voltage drops on transistors $Q_3$ and $Q_4$ mirror the gate-source voltage drop on transistor $Q_B$. In this manner, the reference current $I_{REF}$ defines the DC bias current flowing through each symmetrical side of the inventive amplifier topology 10. The extension of the biasing circuit 142 does not impact the impedance matching behavior as previously described.

Figure 7:
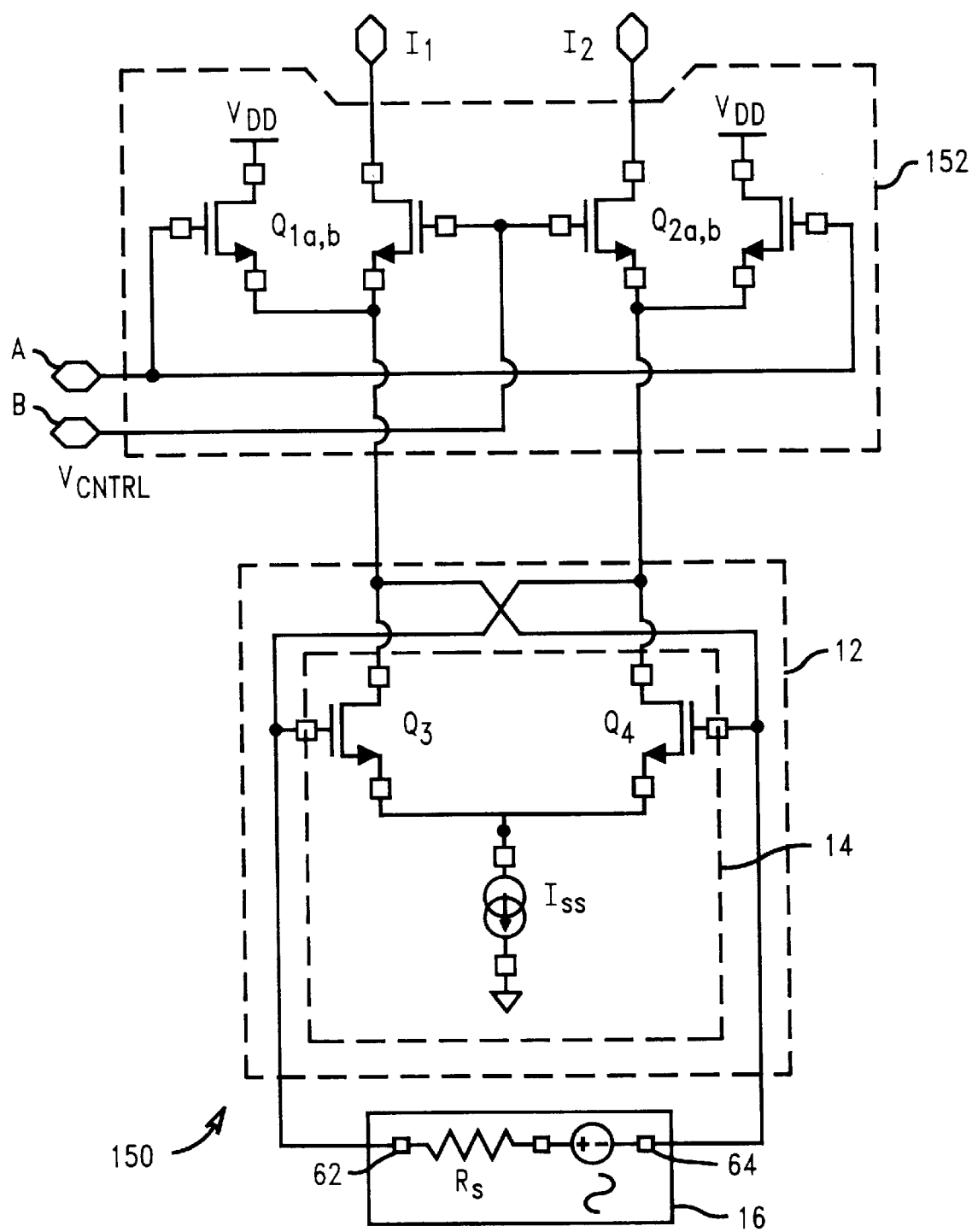
FIG. 7 illustrates the inventive amplifier circuit shown in FIG. 1 utilized in a voltage controllable amplifier.

FIG. 7 illustrates the inventive amplifier circuit 12 shown in FIG. 1 utilized in a voltage controllable amplifier, shown generally at 150. Basically, the current collector circuit 22 of FIG. 1 has been replaced with a conventional current switching circuit 152 including transistors $Q_{1a}$, $Q_{1b}$, $Q_{2a}$, and $Q_{2b}$ controlled by a control voltage $V_{CNTRL}$. The extension of the current switching circuit 152 does not impact the impedance matching behavior as previously described. Depending upon the respective values of the control voltage $V_{CNTRL}$ at nodes A and B, more current can be steered through transistors $Q_{1b}$ and $Q_{2a}$ to the outputs $I_1$ and $I_2$, or more current can be steered through the transistors $Q_{1a}$ and $Q_{2b}$ to $V_{DD}$, which is essentially an AC ground. Accordingly, by adjusting $V_{CNTRL}$, the amount of output current ($I_1$ and $I_2$), and hence the gain of the circuit, can be controlled.

As is apparent from the above description, the inventive amplifier topology provides a low noise, power-matched amplifier without the need for an external matching network.

While the invention has been described with particular reference to the drawings, it should be understood that various modifications could be made without departing from the spirit and scope of the present invention.

What is claimed is:

1. In a communication transceiver receiving a signal from a signal source defined by a source impedance between first and second nodes, an amplifier having an input impedance matched to the source impedance comprising:

a first transconductance cell comprising first and second transistors each having control, supply and output elements, the first transconductance cell receiving the signal from the signal source at the first and second control elements and developing a modified version of the signal as an output current signal at the first and second output elements, respectively, wherein the control element of the first transistor is connected to the output element of the second transistor, and the control element of the second transistor is connected to the output element of the first transistor, the first transconductance cell having a first transconductance related to the input impedance; and a second transconductance cell comprising third and fourth transistors connected to the first and second output elements, the second transconductance cell combining currents appearing at the first and second output elements and developing a combined output current signal at respective output terminals thereof, the second transconductance cell having a second transconductance related to the input impedance.

2. The amplifier of claim 1, wherein the second transconductance is less than the first transconductance.

3. The amplifier of claim 1, wherein the first and second transconductance cells, are not equal.

4. The amplifier of claim 1, wherein the third and fourth transistors each have control, supply and output elements, wherein the third and fourth supply elements are connected to the first and second output elements, and wherein the combined output current signal is developed at the third and fourth output elements.

5. The amplifier of claim 4, wherein the first through fourth transistors comprise Metal Oxide Semiconductor Field Effect Transistors (MOSFETs) having gate, source and drain elements corresponding to the control, supply and output elements, respectively.

6. The amplifier of claim 5, wherein the first through fourth transistors comprise n-channel MOSFETs, with the third source element connected to the first drain element, and the fourth source element connected to the second drain element.

7. The amplifier of claim 5, wherein the first and second transistors comprise p-channel MOSFETs and the third and fourth transistors comprise n-channel MOSFETs, with the third source element connected to the second drain element, and the fourth source element connected to the first drain element.

8. The amplifier of claim 1, wherein the first transconductance cell comprises a differential amplifier receiving the signal from the signal source and developing a differential output current signal at the first and second output elements.

9. In a communication transceiver receiving a signal from a signal source defined by a source impedance between first and second nodes, an amplifier having an input impedance matched to the source impedance comprising:

a first transconductance cell comprising first and second transistors connected to the first and second nodes, respectively, the first and second transistors receiving the signal from the signal source and developing a modified version of the signal as a first output current signal at first and second output terminals, respectively, the first transconductance cell having a first transconductance related to the input impedance;

a second transconductance cell comprising third and fourth transistors connected to the first and second nodes, respectively, the third and fourth transistors receiving the signal from the signal source and developing a modified version of the signal as a second output current signal at third and fourth output terminals, respectively, the second transconductance cell having a second transconductance related to the input impedance; and oppositely connected first and second inverter circuits connected between the first and second nodes.

10. The amplifier of claim 9, wherein the first and second transistors each have control, supply and output elements, with the first and second supply elements connected to the first and second nodes, respectively, and the first and second output elements defining the first and second output terminals, respectively, and the third and fourth transistors each have control, supply and output elements, with the third and fourth supply elements connected to the first and second nodes, respectively, and the third and fourth output elements defining the third and fourth output terminals, respectively.

11. The amplifier of claim 10, wherein the first through fourth transistors comprise Metal Oxide Semiconductor Field Effect Transistors (MOSFETs) having gate, source and drain elements corresponding to the control, supply and output elements, respectively.

12. The amplifier of claim 11, wherein the first and second transistors comprise n-channel MOSFETs, and the third and fourth transistors comprise p-channel MOSFETs.

13. The amplifier of claim 9, further comprising:

a first combiner circuit receiving the first output current signal from the first and second output terminals and developing a first differential current signal;

a second combiner circuit receiving the second output current signal from the third and fourth output terminals and developing a second differential current signal; and a third combiner circuit receiving the first and second differential current signals from the first and second combiner circuits, respectively, and developing a third differential current signal.

* * * * *